(12) United States Patent
Liang et al.

(10) Patent No.: US 8,859,378 B2
(45) Date of Patent: Oct. 14, 2014

(54) FIN FIELD-EFFECT TRANSISTOR AND METHOD FOR MANUFACTURING THE SAME

(75) Inventors: Qingqing Liang, Lagrangeville, NY (US); Huicai Zhong, San Jose, CA (US); Huilong Zhu, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 327 days.

(21) Appl. No.: 13/377,141

(22) PCT Filed: Aug. 10, 2011

(86) PCT No.: PCT/CN2011/078207
§ 371 (c)(1),
(2), (4) Date: Dec. 8, 2011

(87) PCT Pub. No.: WO2012/151797
PCT Pub. Date: Nov. 15, 2012

(65) Prior Publication Data
US 2012/0286337 A1 Nov. 15, 2012

(30) Foreign Application Priority Data
May 6, 2011 (CN) .......................... 2011 1 0116545

(51) Int. Cl.
| H01L 21/336 | (2006.01) |
| H01L 27/12 | (2006.01) |
| H01L 21/8234 | (2006.01) |
| H01L 21/84 | (2006.01) |
| H01L 27/088 | (2006.01) |
| H01L 29/66 | (2006.01) |

(52) U.S. Cl.
CPC .... *H01L 27/1211* (2013.01); *H01L 21/823431* (2013.01); *H01L 21/845* (2013.01); *H01L 27/0886* (2013.01); *H01L 29/66545* (2013.01)
USPC ............. 438/300; 257/E21.431; 257/E21.444

(58) Field of Classification Search
CPC ...................... H01L 21/823431; H01L 21/845
USPC .................... 438/300; 257/E21.431, E21.444
See application file for complete search history.

(56) References Cited

U.S. PATENT DOCUMENTS 7,129,550 B2 10/2006 Fujiwara et al.
7,732,859 B2 6/2010 Anderson et al.
(Continued)

FOREIGN PATENT DOCUMENTS

CN 102034831 A 4/2011

OTHER PUBLICATIONS

Int'l Search Report (Feb. 6, 2012).
(Continued)

*Primary Examiner* — Mary Wilczewski
*Assistant Examiner* — Toniae Thomas
(74) *Attorney, Agent, or Firm* — Goodwin Procter LLP

(57) ABSTRACT

Embodiments of the present invention disclose a method for manufacturing a Fin Field-Effect Transistor. When a fin is formed, a dummy gate across the fin is formed on the fin, a spacer is formed on sidewalls of the dummy gate, and a cover layer is formed on the first dielectric layer and on the fin outside the dummy gate and the spacer; then, an self-aligned and elevated source/drain region is formed at both sides of the dummy gate by the spacer, wherein the upper surfaces of the gate and the source/drain region are in the same plane. The upper surfaces of the gate and the source/drain region are in the same plane, making alignment of the contact plug easier; and the gate and the source/drain region are separated by the spacer, thereby improving alignment accuracy, solving inaccurate alignment of the contact plug, and improving device AC performance.

17 Claims, 16 Drawing Sheets

(56) References Cited

U.S. PATENT DOCUMENTS

| | | |
|---|---|---|
| 2005/0051825 A1 | 3/2005 | Fujiwara et al. |
| 2009/0020764 A1 | 1/2009 | Anderson et al. |
| 2009/0206406 A1 | 8/2009 | Rachmady et al. |
| 2012/0313170 A1* | 12/2012 | Chang et al. .................. 438/163 |
| 2013/0075818 A1* | 3/2013 | Lee et al. ...................... 438/158 |
| 2013/0175579 A1* | 7/2013 | Cheng et al. .................. 438/151 |
| 2013/0181264 A1* | 7/2013 | Liao et al. ..................... 438/299 |
| 2013/0214357 A1* | 8/2013 | Chang et al. .................. 438/151 |
| 2013/0270638 A1* | 10/2013 | Adam et al. .................. 438/151 |

OTHER PUBLICATIONS

Written Opinion (Feb. 6, 2012).

\* cited by examiner

FIN FIELD-EFFECT TRANSISTOR AND METHOD FOR MANUFACTURING THE SAME

This application is a national phase application of, and claims priority to, PCT Application No. PCT/CN2011/078207, filed on Aug. 10, 2011, entitled "FIN FIELD-EFFECT TRANSISTOR AND METHOD FOR MANUFACTURING THE SAME," which claimed priority to Chinese Application 201110116545.5, filed on May 6, 2011. Both the PCT application and Chinese application are incorporated herein by reference in their entireties.

FIELD OF THE INVENTION

The present invention relates to the field of semiconductor manufacturing technology, and more particularly to a Fin Field-Effect Transistor and a method for manufacturing the same.

BACKGROUND OF THE INVENTION

With the high level of integration in semiconductor devices, the channel length of a Metal-Oxide-Semiconductor Field-Effect Transistor (MOSFET) has become increasingly shorter. Those effects that are negligible in a long-channel model of MOSFET have become more significant, and in some cases, a major factor affecting the performance of the device. This phenomenon is called a short-channel effect. The short-channel effect may degrade electrical performance of the device, causing problems such as decreased threshold voltage of the gate, increased power consumption and reduced signal-to-noise ratio.

In order to control the short-channel effect, improvements have been made to conventional transistor devices in some aspects. For example, in one aspect, the channel of the device can be doped with more impurities such as phosphorus and boron, but this may cause carrier mobility decrease in the channel; in another aspect, stress in the channel can be enhanced, but strain increase is limited by the conventional SiGe Positive-channel Metal Oxide Semiconductor (PMOS) strained silicon technique; and in yet another aspect, the thickness of the gate oxide can be reduced, but we still face technological constraints: the reduction in thickness of the gate oxide does not match the reduction in width of the gate, resulting in increased the leakage current. With the channel size continuing to shrink, the improvements can no longer resolve the increasingly significant short-channel effect.

In order to solve the problem of short-channel effect, a three-dimensional Fin Field-Effect Transistor (FinFET) has been proposed. A FinFET is a transistor with a fin-shaped channel structure, in which some surfaces of a thin fin act as the channel, allowing enhanced operating current, and thus avoiding the short-channel effect in a conventional transistor.

As shown in FIG. 1, a structural diagram of an existing FinFET, comprising: a fin 100; a gate 102 on the upper surface and the sides of the fin; and source and drain regions 104 at respective ends of the fin. Generally, forming of the FinFET comprises: forming a fin 100 and a gate 10; forming source and drain regions 104 at respective ends of the fin; and forming a contact plug on the gate 102, the source region 104 and the drain region 106.

However, the method above for forming a FinFET device has the problem that, in formation of the contact plug, the contact plug should be aligned with the gate, the source region and the drain region, and as the level of integration increases, the distance between gates is shortening, resulting in difficulty in the alignment of the contact plug and poor alignment accuracy. For example, the contact plug portion at the source/drain region may come into contact with the gate, or, the contact plug portion at the gate may come into contact with the source/drain region, directly leading to a short circuit of the device. Or, even if isolation between the contact plug at the source/drain region and the gate is realized, a large parasitic overlap capacitance will be formed therebetween, this may still reduce the AC performance and the speed of the device.

SUMMARY OF THE INVENTION

An embodiment of the present invention provide a Fin Field-Effect Transistor and a method for manufacturing the same, in order to solve inaccurate alignment of the contact plug, and improve the AC performance of the device.

In order to achieve the object above, an embodiment of the present invention provides the following technical solution.

A method for manufacturing a Fin Field-Effect Transistor, comprising:
  providing a substrate;
  forming a fin in the substrate, and forming a first dielectric layer on the substrate outside the fin;
  forming a dummy gate across the fin on the first dielectric layer and on the fin, forming a spacer on sidewalk of the dummy gate, and forming a cover layer on the first dielectric layer and on the fin outside the dummy gate and the spacer, wherein upper surfaces of both the cover layer and the dummy gate are in the same plane;
  removing portions of both the cover layer and the first dielectric layer at both sides of the dummy gate, so as to form a source/drain opening such that the fin at both sides of the dummy gate is exposed in the source/drain opening;
  filling the source/drain opening to form a source/drain region comprising the fin at both sides of the dummy gate;
  removing the dummy gate and removing the first dielectric layer under the dummy gate, so as to form a gate region opening such that the fin under the dummy gate is exposed in the gate region opening;
  filling the gate region opening to form a gate covering the fin, such that upper surfaces of both the gate and the source/drain region are in the same plane; and
  forming a contact plug on the gate and on the source/drain region.

Optionally, after forming the gate and before forming the contact plug, the method further comprises: removing a portion of the gate and a portion of the source/drain region, and filling to form a gate isolation region and a source/drain isolation region.

Optionally, edges of both the gate and the source/drain region are not aligned in a direction along the fin.

Optionally, the step for forming the source/drain region comprises: filling the source/drain opening by epitaxial growth to form the source/drain region comprising the fin at both sides of the dummy gate.

Optionally, the cover layer comprises a second dielectric layer and a third dielectric layer on the second dielectric layer.

Optionally, the second dielectric layer, the third dielectric layer and the spacer are made of different dielectric materials, respectively.

Optionally, after the step for forming a fin, the method further comprises: forming a cap layer on the fin, and the method still further comprises: forming a dummy gate across the fin on both the first dielectric layer and the cap layer, forming a spacer on sidewalls of the dummy gate, and forming a cover layer on the first dielectric layer and on the cap layer outside the dummy gate and the spacer, wherein upper surfaces of both the cover layer and the dummy gate are in the same plane; and removing the first dielectric layer, the cover layer and the cap layer at both sides of the dummy gate to form a source/drain opening.

Optionally, an upper surface of the first dielectric layer is flushed with an upper surface of the fin.

The present invention further provides a Fin Field-Effect Transistor formed according to a manufacturing method above, and the Fin Field-Effect Transistor comprises:

a substrate;

a fin on the substrate, wherein the fin has a first end and a second end opposite to each other, and has a third end and a fourth end opposite to each other;

a gate covering surfaces of the first end and the second end of the fin and covering an upper surface of the fin;

a source/drain region at both sides of the third end and the fourth end of the fin, wherein upper surfaces of the source/drain region and the gate are in the same plane;

a spacer between the source/drain region and the gate above the upper surface of the fin; and a contact plug on the gate and on the source/drain region.

Optionally, the Fin Field-Effect Transistor further comprises: a source/drain isolation region between adjacent source/drain regions, and a gate isolation region between adjacent gates.

Optionally, edges of both the gate and the source/drain region are not aligned in the direction along a line connecting the third end and the fourth end of the fin.

In comparison with the prior art, the technical solutions above have the following advantages.

In the Fin Field-Effect Transistor and the method for manufacturing the same according to the embodiments of the present invention, when a fin has been formed, a dummy gate across the fin and a spacer of the dummy gate are formed on the fin, then, by using the dummy gate and the spacer as a mask and the isolation provided by them, a gate and a source/drain region equal in height are formed inside and outside the spacer, respectively. The upper surface of the gate and the upper surface of the source/drain region are in the same plane, making the alignment of the contact plug easier; and the gate and the source/drain region are separated by the spacer, which can improve alignment accuracy, solve inaccurate alignment of the contact plug, and improve the AC performance of the device.

BRIEF DESCRIPTION OF THE DRAWINGS

The above and other objects, features and advantages of the present invention will become more apparent when read in conjunction with the accompanying drawings, in which the same reference numerals denote the same components. The figures are not drawn to scale, in order to not unnecessarily obscure the essence of the present invention.

DETAILED DESCRIPTION OF THE INVENTION

For a better understanding of the objects, features and advantages above of the present invention, the embodiments of the present invention will be described in details hereinafter with reference to the accompanying drawings.

In the following description, numerous specific details are set forth, in order to provide a thorough understanding of the present invention. It will be apparent to one skilled in the art that the present invention may be practiced without these specific details, and that equivalents to the present invention may be obtained without deviation from the essence of the present invention. Hence the present invention is not limited to the embodiments disclosed herein.

Moreover, the present invention is described in details in conjunction with the accompanying drawings. For illustrative purposes, the cross-sectional views of the device structures are locally and disproportionally enlarged, and do not limit the scope of protection of the present invention. Furthermore, in practice, three-dimensional sizes including length, width and depth should be included.

Figure 1:
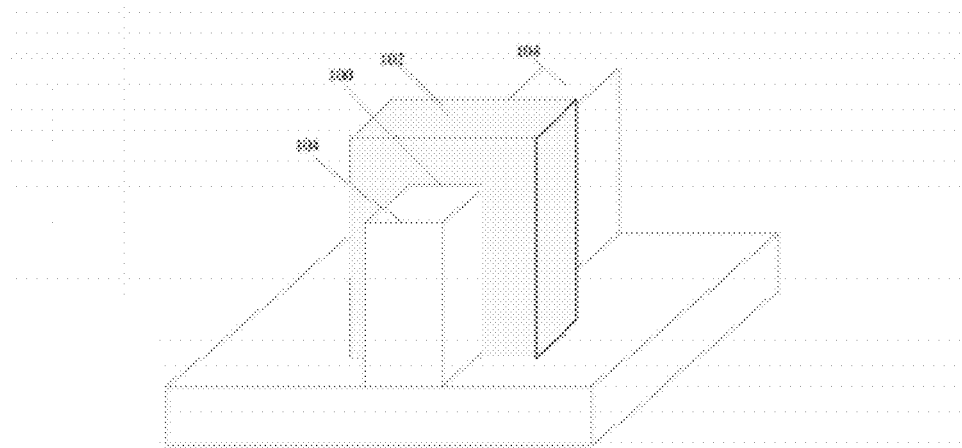
FIG. 1 is a structural diagram of a FinFET in the prior art.
Figure 2:
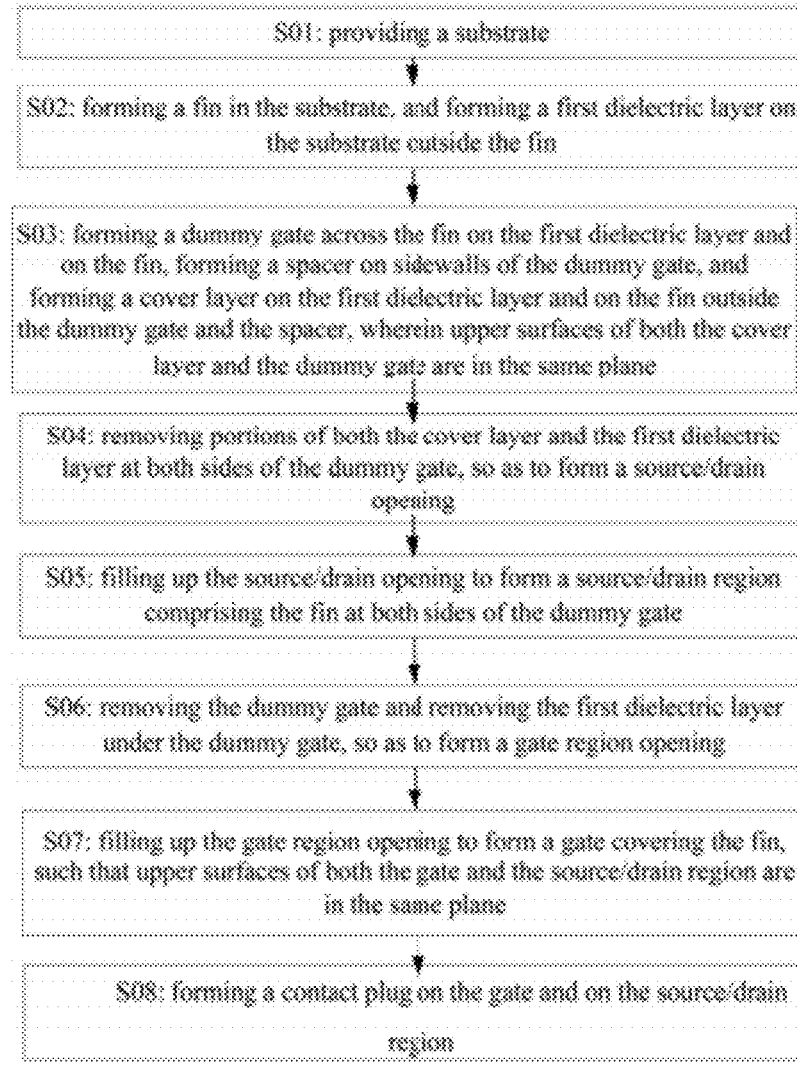
FIG. 2 is a flow chart of a method for manufacturing a FinFET according to an embodiment of the present invention.

In order to solve the problem of inaccurate alignment of the contact plug in FinFET manufacturing, the present invention provides a method for manufacturing a FinFET, as shown in FIG. 2, a flow chart of a method for manufacturing a FinFET according to the present invention. The method of the present invention will be described in details in conjunction with FIG. 3 to FIG. 31. It is noted that the embodiments disclosed herein are preferred technical solutions, described herein for a better understanding of the present invention, which should not be interpreted as limiting the present invention.

In step S01, a substrate 200 is provided.

Figure 3:
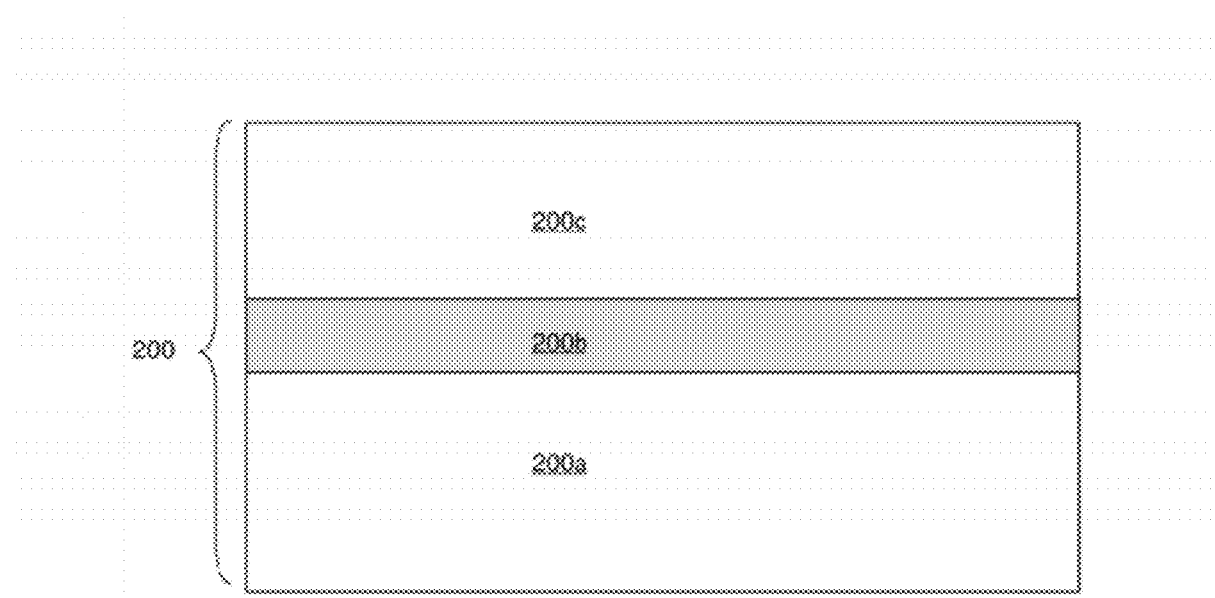
FIG. 3 to FIG. 31 illustrate a method for manufacturing a FinFET according to an embodiment of the present invention with cross-sectional views, including section A-A', section B-B' and section C-C' corresponding to a top view.

As shown in FIG. 3, in this embodiment, the substrate is a silicon on insulator (SOI) substrate 200, and the SOI substrate 200 comprises a back substrate 200a, a buried oxide layer 200b and a topmost silicon layer 200c. In other embodiments, the substrate may have other structures comprising a semiconductor layer and an insulating layer.

Figure 4:
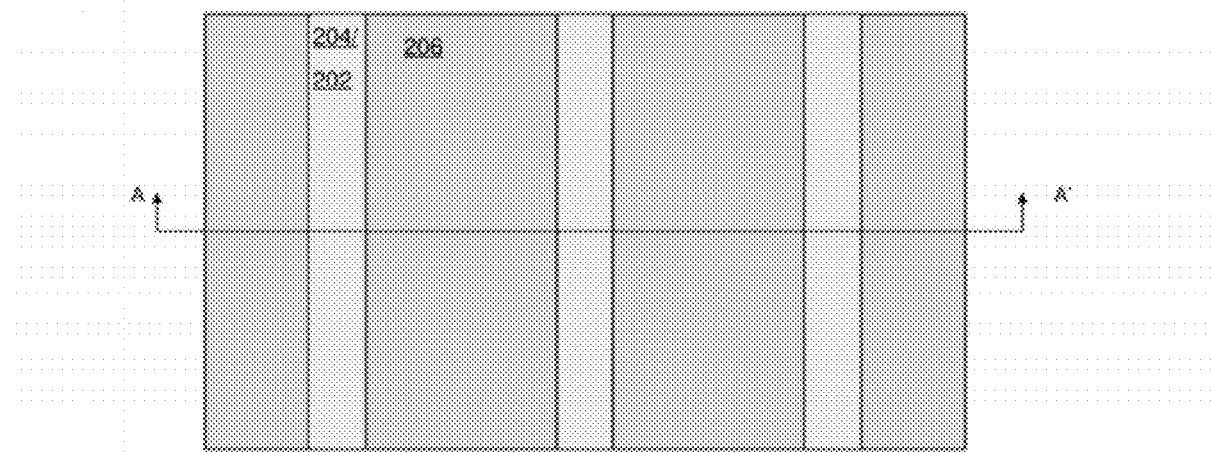
Figure 5:
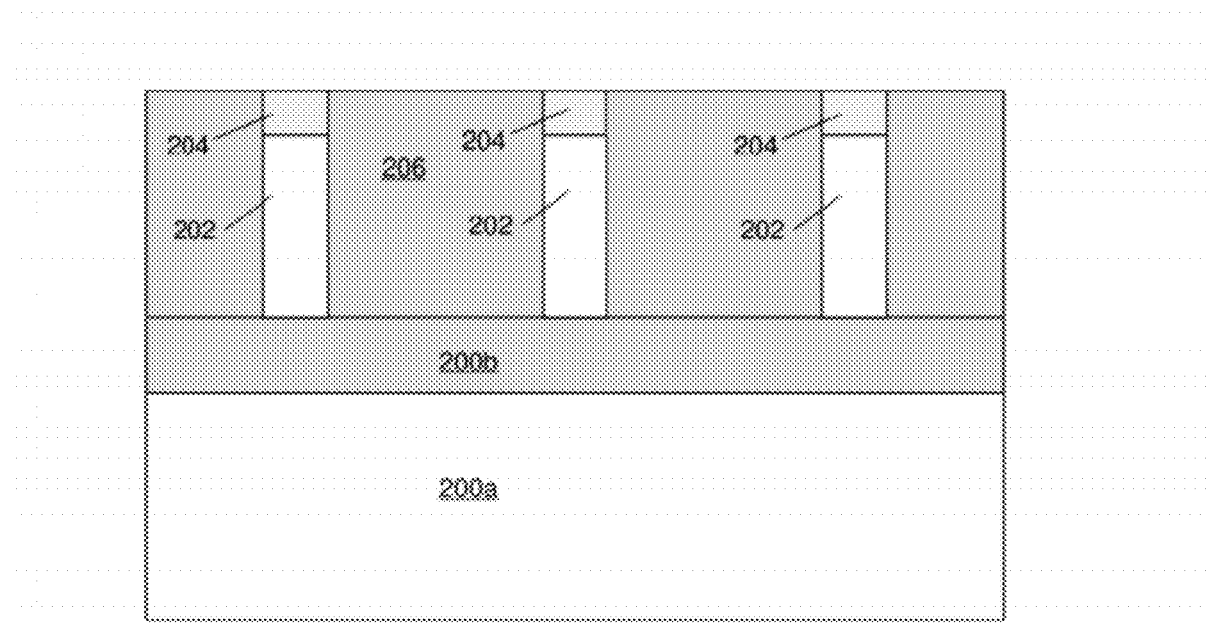

In step S02, a fin 202 is formed in the substrate 200, and a first dielectric layer 206 is formed on the substrate outside the fin 202, as shown in FIG. 4 (top view) and FIG. 5 (section A-A' of FIG. 4).

Specifically, firstly, a cap layer 204 may be formed on the topmost silicon layer 200c, then the cap layer 204 may be patterned, and the topmost silicon layer 200c may be etched by, e.g., reactive-ion etching (RIE), and using the cap layer 204 as a hard mask, to form a fin 202 in the topmost silicon layer 200c. Optionally, the cap layer 204 may then be removed; alternatively, the cap layer 204 may be maintained to protect the fin from being affected in subsequent processes. Then, a dielectric such as SiO2 may be deposited and then planarized by, e.g., Chemical Mechanical Polishing (CMP), to form a first dielectric layer 206 on the substrate 200b outside the fin 202. The upper surface of the first dielectric layer is even with the upper surface of the fin.

Figure 6:
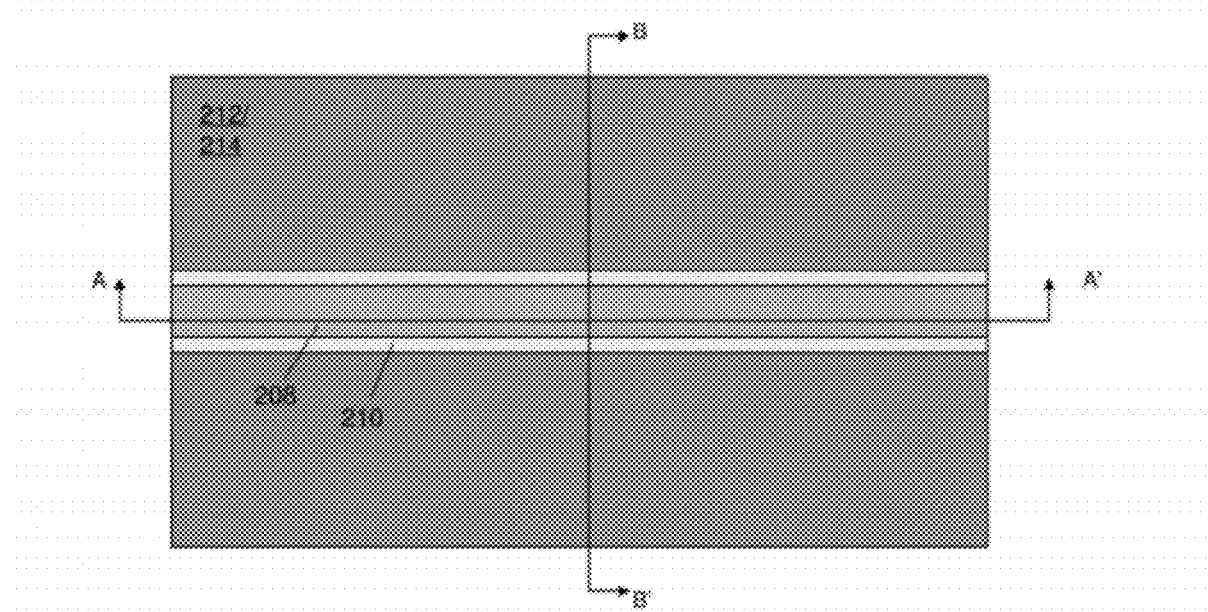
Figure 7:
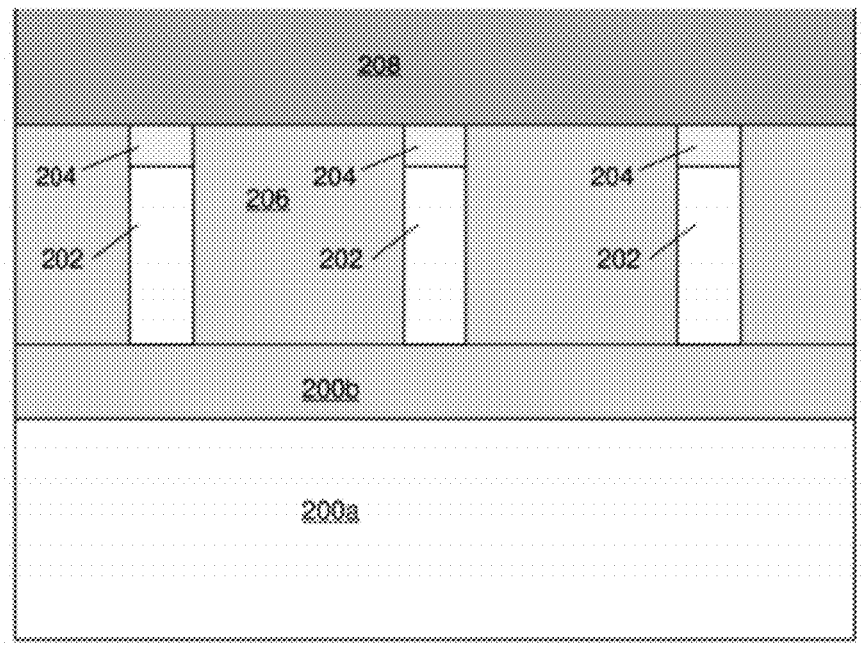
Figure 8:
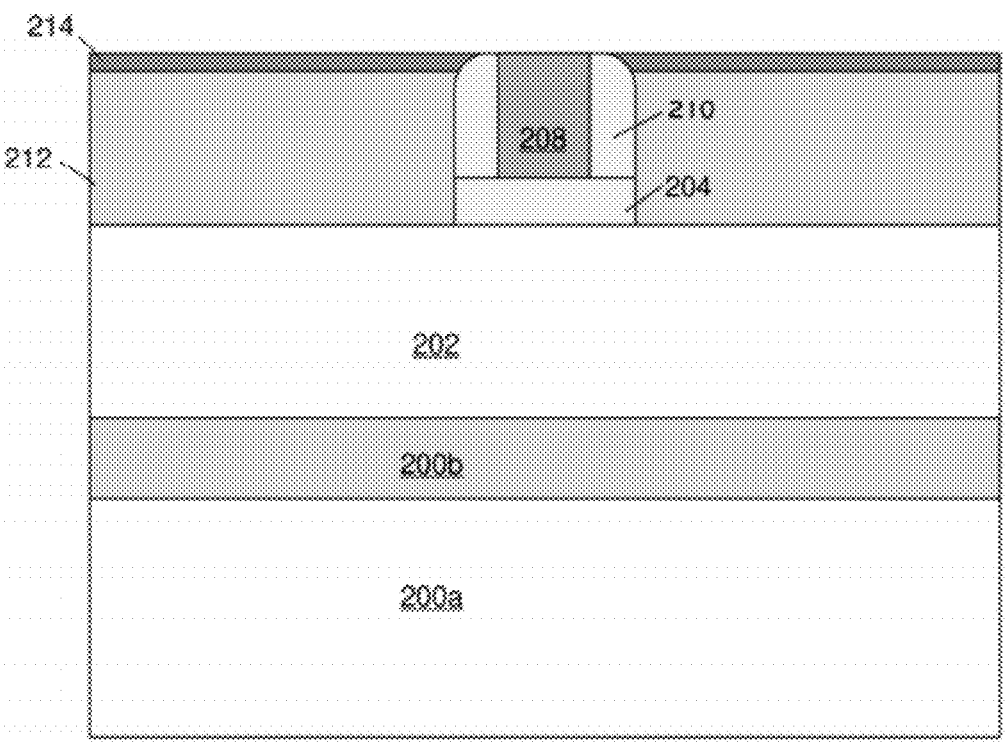

In step S03, a dummy gate 208 across the fin 202 is formed on the first dielectric layer 206 and the fin 202, a spacer 210 is formed on sidewalls of the dummy gate 208, and a cover layer 212 and 214 is formed on the first dielectric layer 206 and the fin 202 outside the dummy gate 208 and the spacer 210. The upper surface of the cover layer 212 and 214 and the upper surface of the dummy gate 208 are in the same plane, as shown in FIG. 6 (top view). FIG. 7 (section A-A' of FIG. 6) and FIG. 8 (section B-B' of FIG. 6).

Specifically, firstly, a dummy gate, e.g., polysilicon, may be deposited on the device, and then patterned, to form a dummy gate 208 across the fin 202. Then, a spacer 210 may be formed on sidewalls of the dummy gate 208 by depositing, e.g., Si3N4, and etching. The dummy gate 208 and the spacer 210 may be used as a mask pattern layer in subsequent processes, which is good for self-alignment and formation of the source/drain region and the gate in subsequent processes.

Then, a cover layer may be formed, and the cover layer may have a one-layer structure or a multi-layer structure. In this embodiment, preferably, the cover layer may have a two-layer structure comprising a second dielectric layer and a third dielectric layer, and preferably, the third dielectric layer, the second dielectric layer and the spacer are all made of different dielectrics; this can facilitate self-alignment and formation of the source/drain region and the gate in subsequent processes, and simplify the procedure. In this embodiment, the cover layer may be formed by depositing a second dielectric layer, e.g., SiO2, and the third dielectric layer, e.g., a high dielectric constant (high-K) dielectric (e.g., HfO2), and planarization, e.g., Chemical Mechanical Polishing (CMP), with the dummy gate 208 being a stop layer.

Accordingly, in an embodiment where the cap layer has been removed, a cover layer 212 and 214 may be formed on the first dielectric layer 206 and the fin 202 outside the dummy gate 208 and the spacer 210. Alternatively, in an embodiment where the cap layer has not been removed, a dummy gate 208 across the fin is formed on the first dielectric layer 206 and the cap layer 204, and a spacer 210 is formed on sidewalls of the dummy gate 208, a cover layer 212 and 214 may be formed on the first dielectric layer 206 and the cap layer 204 outside the dummy gate 208 and the spacer 210, with the upper surface of the cover layer 212 and 214 and the upper surface of the dummy gate 208 being in the same plane.

Figure 9:
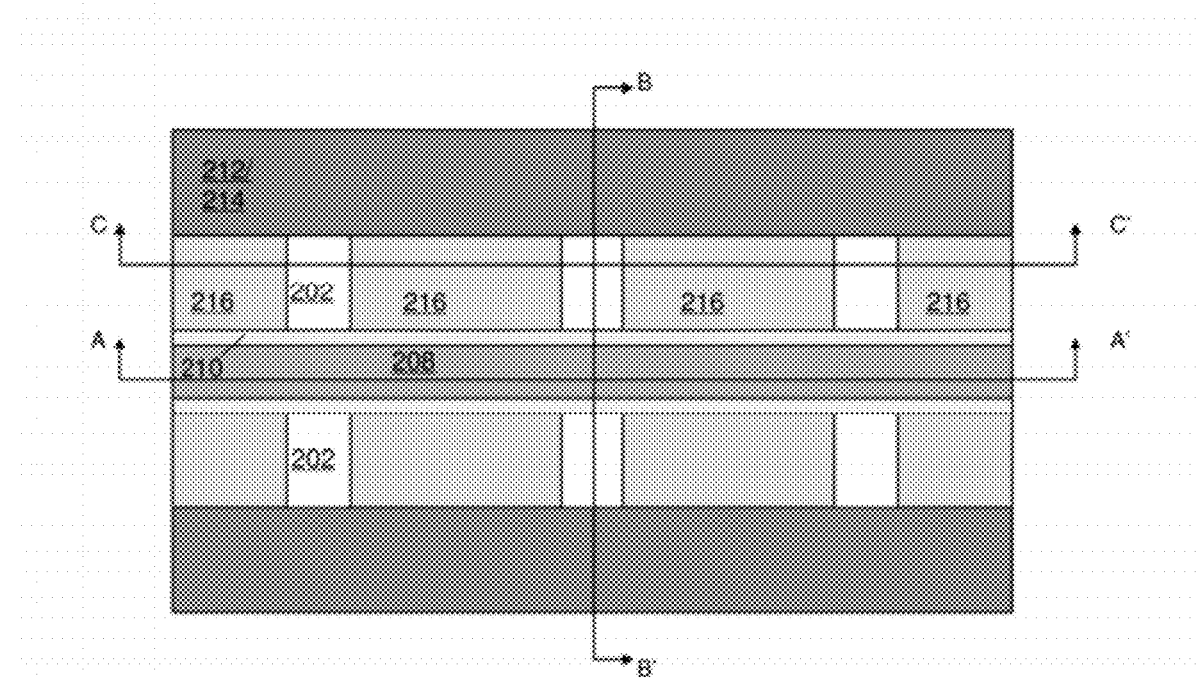
Figure 10:
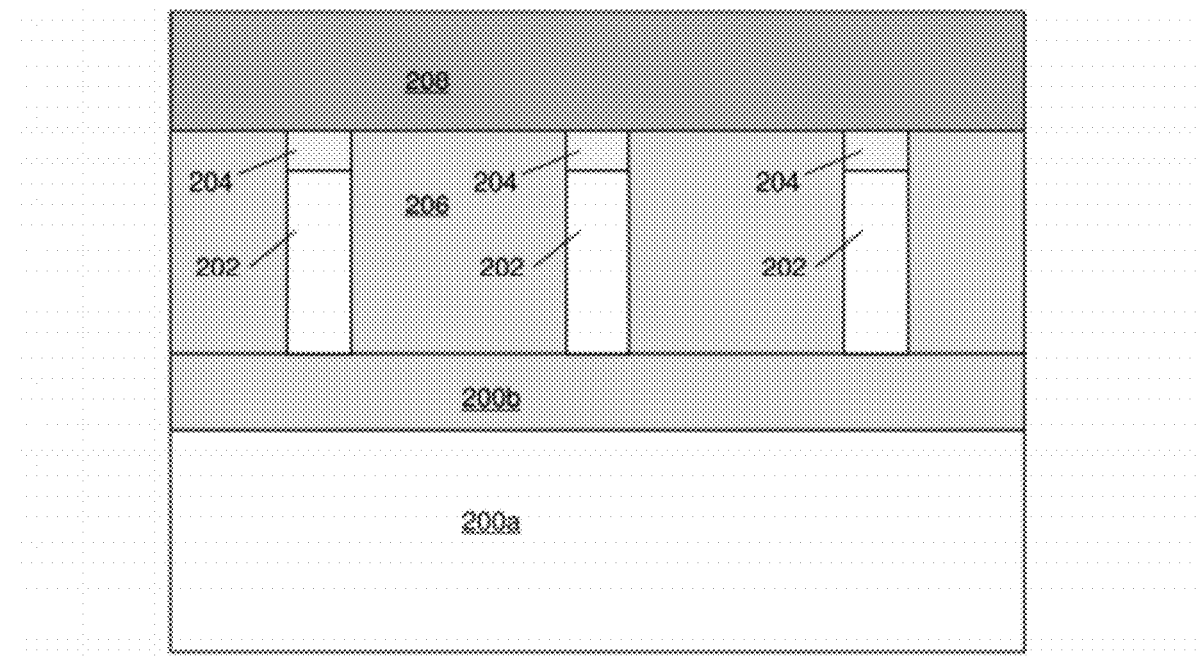
Figure 11:
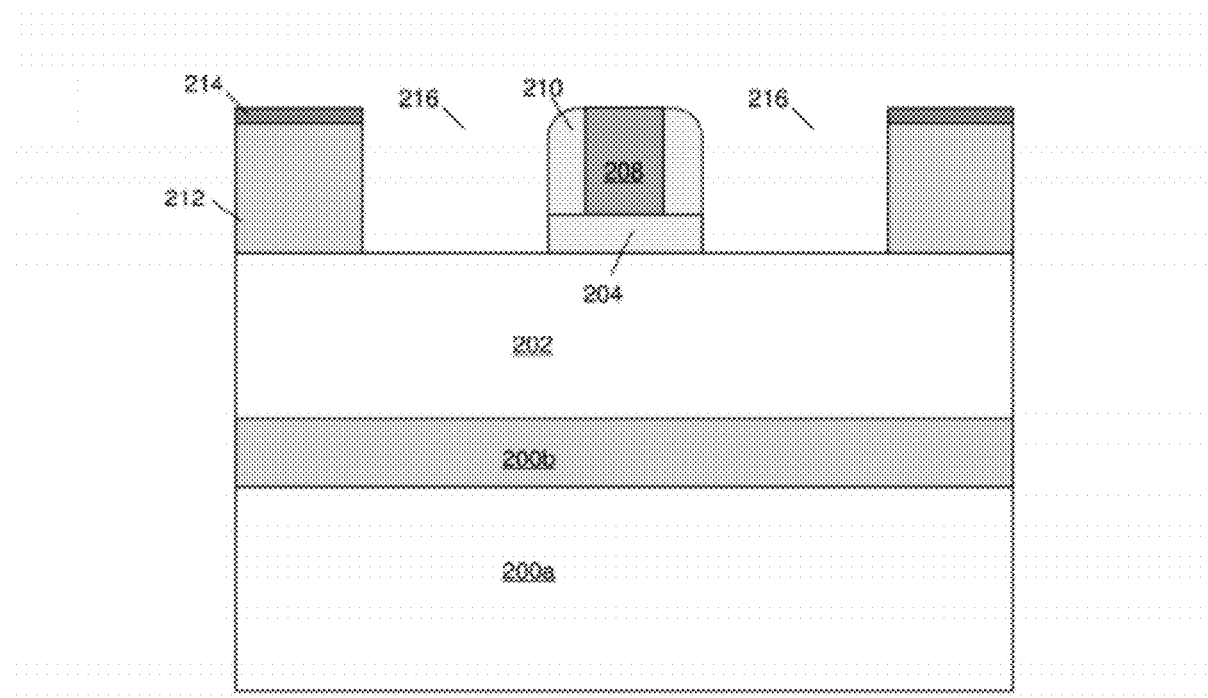
Figure 12:
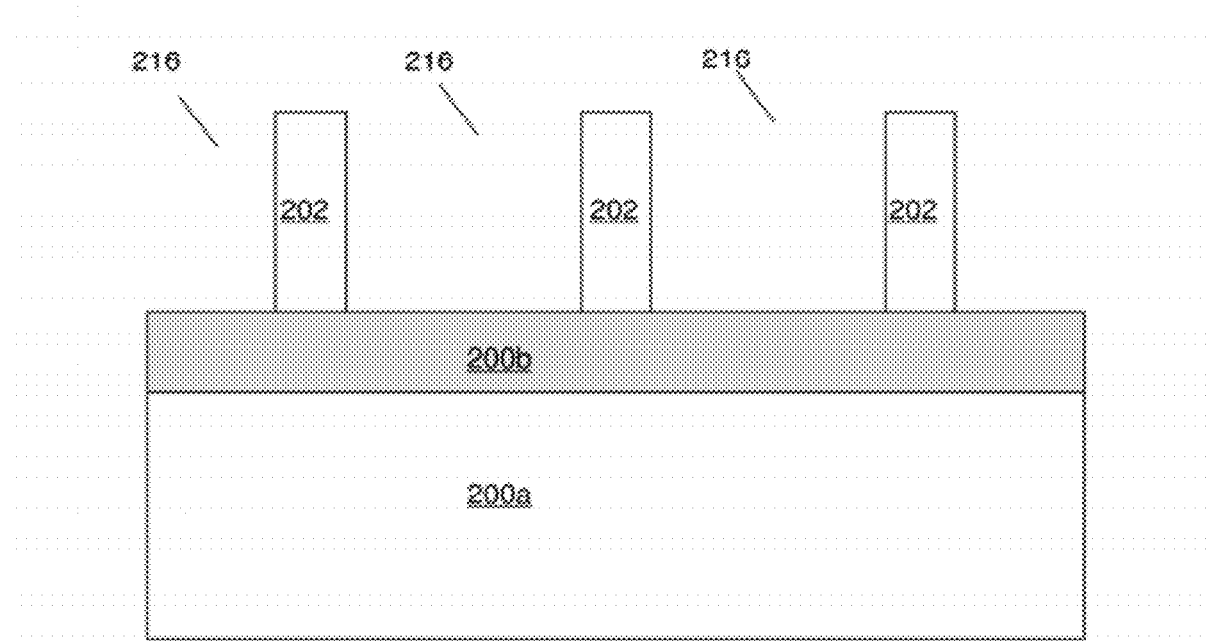

In step S04, the cover layer 212 and 214 and the first dielectric layer 206 at both sides of the dummy gate 208 are removed, to form a source/drain opening 216 such that the fin 202 at both sides of the dummy gate 208 is exposed in the source/drain opening 216, as shown in FIG. 9 (top view). FIG. 10 (section A-A' of FIG. 9). FIG. 11 (section B-B' of FIG. 9) and FIG. 12 (section C-C' of FIG. 9).

The cover layer 212 and 214 and the first dielectric layer 206 at both sides of the dummy gate 208, may be removed by etching, e.g., RIE, which stops at the fin 202, to fully expose the fin 202 at both sides of the dummy gate 208, thereby forming the source/drain opening 216.

In the embodiment where the cap layer 204 has not been removed, the cap layer 204 on the fin 202 at both sides of the dummy gate 208 may be removed, to fully expose the fin 202 at both sides of the dummy gate 208.

Figure 13:
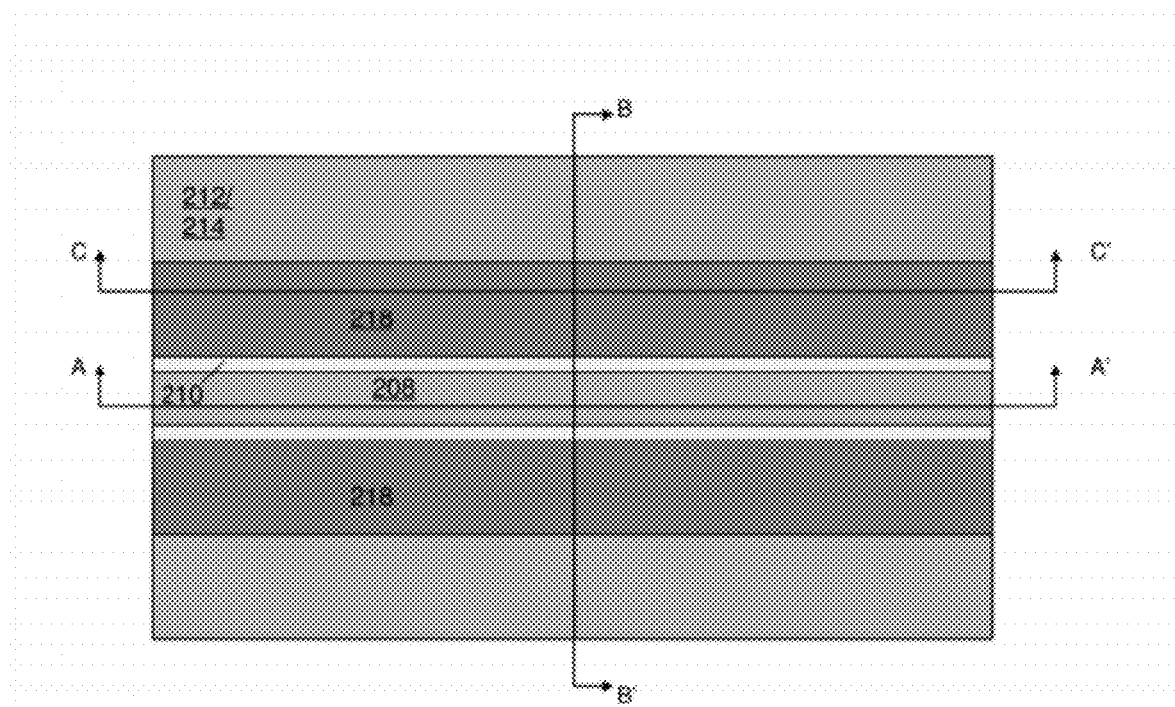
Figure 14:
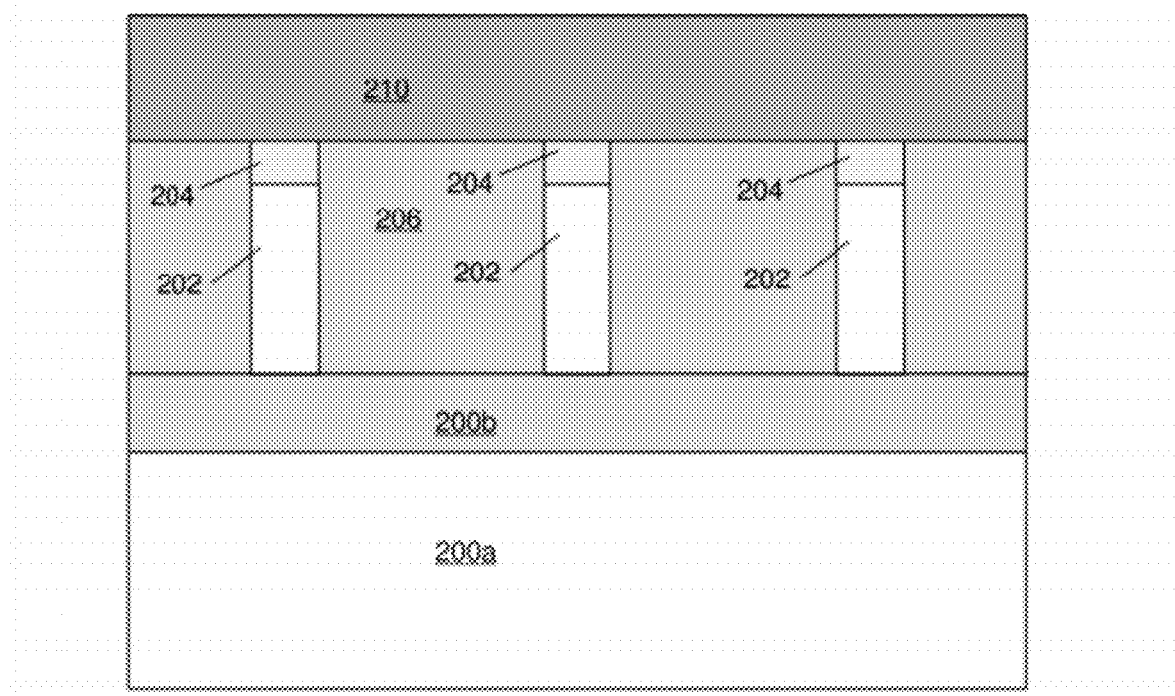
Figure 15:
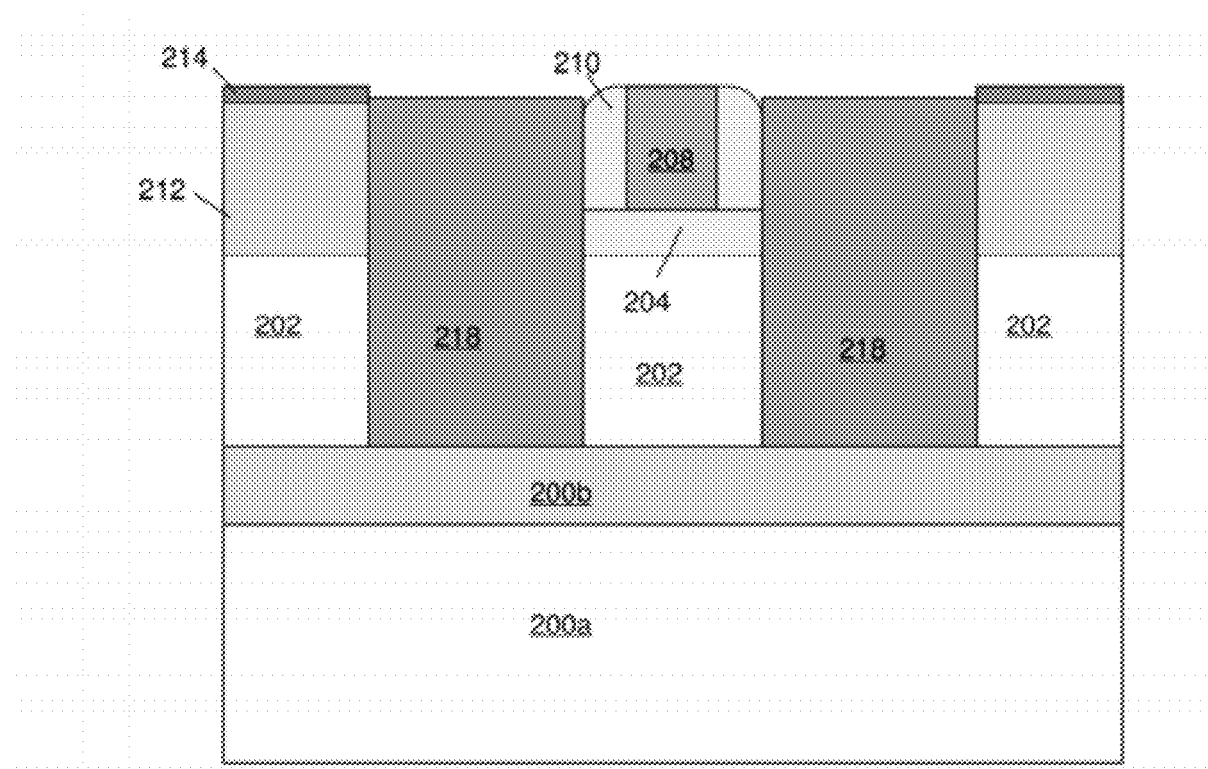
Figure 16:
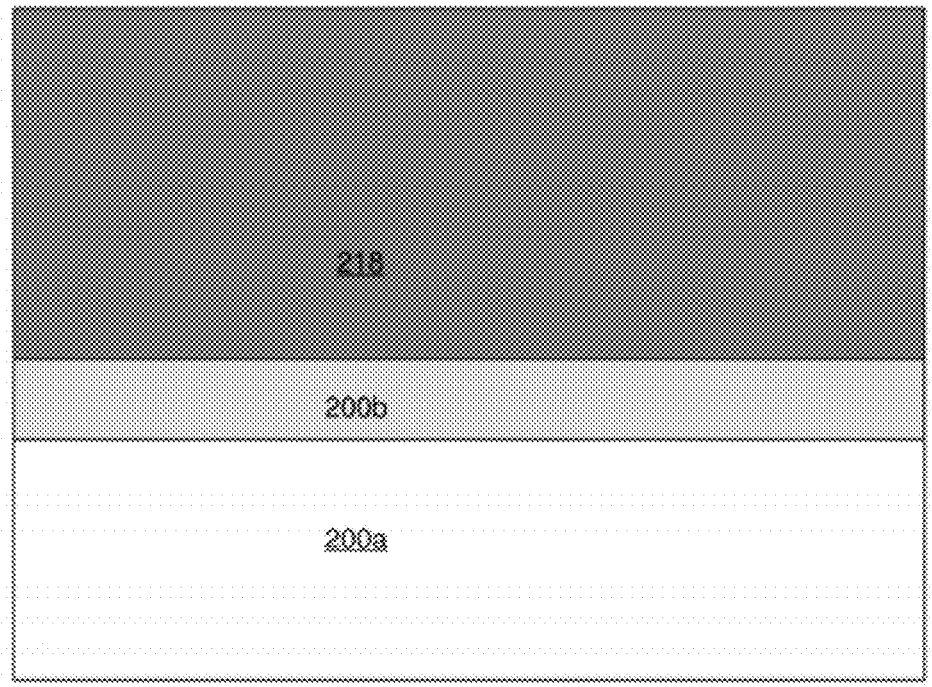

In step S05, the source/drain opening 216 is filled up, to form a source/drain region 218, which comprises the fin 202 at both sides of the dummy gate 208, as shown in FIG. 13 (a top view), FIG. 14 (an A-A' view of FIG. 13), FIG. 15 (a B-B' view of FIG. 13) and FIG. 16 (a C-C' view of FIG. 13).

In this embodiment, the source/drain opening 216 may be filled up by epitaxial growing of an epitaxial layer on the fin 202 at both sides of the dummy gate 208, e.g., SiC for NFET and SiGe for PFET, and CMP, with the dummy gate 208 being a stop layer, so that a source/drain region 218 is formed by the epitaxial layer together with the fin 202 at both sides of the dummy gate 208. In this embodiment, as the epitaxial layer may diffuse to the fin 202 at both sides of the dummy gate 208, the fin 202 at both sides of the dummy gate 208 may be partially or completely converted into the same material as the epitaxial layer (the figure shows the case where it is completely converted into the same material as the epitaxial layer). In other embodiments, the source/drain region 218 may be formed in other suitable ways.

Figure 17:
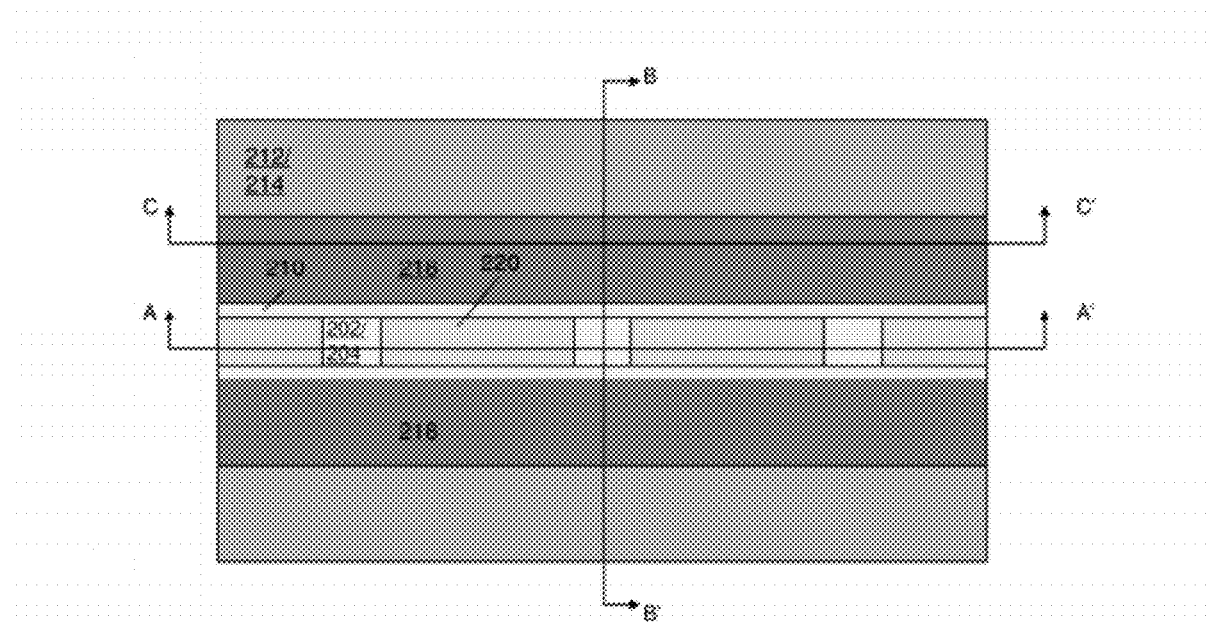
Figure 18:
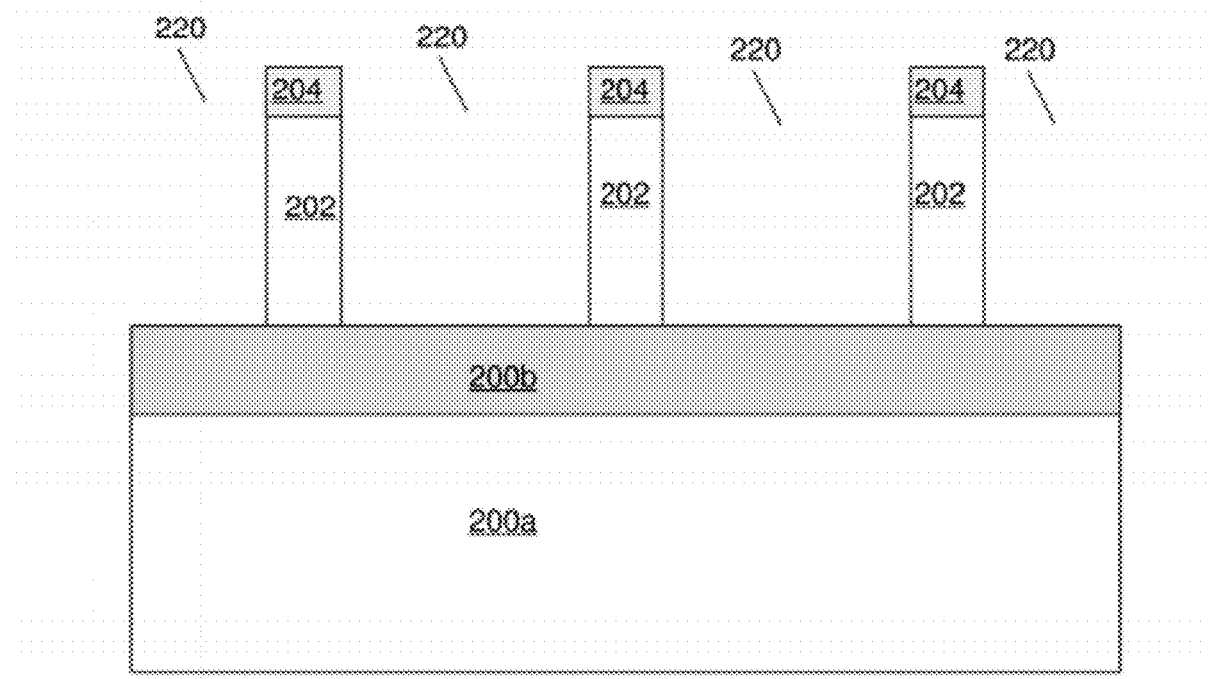
Figure 19:
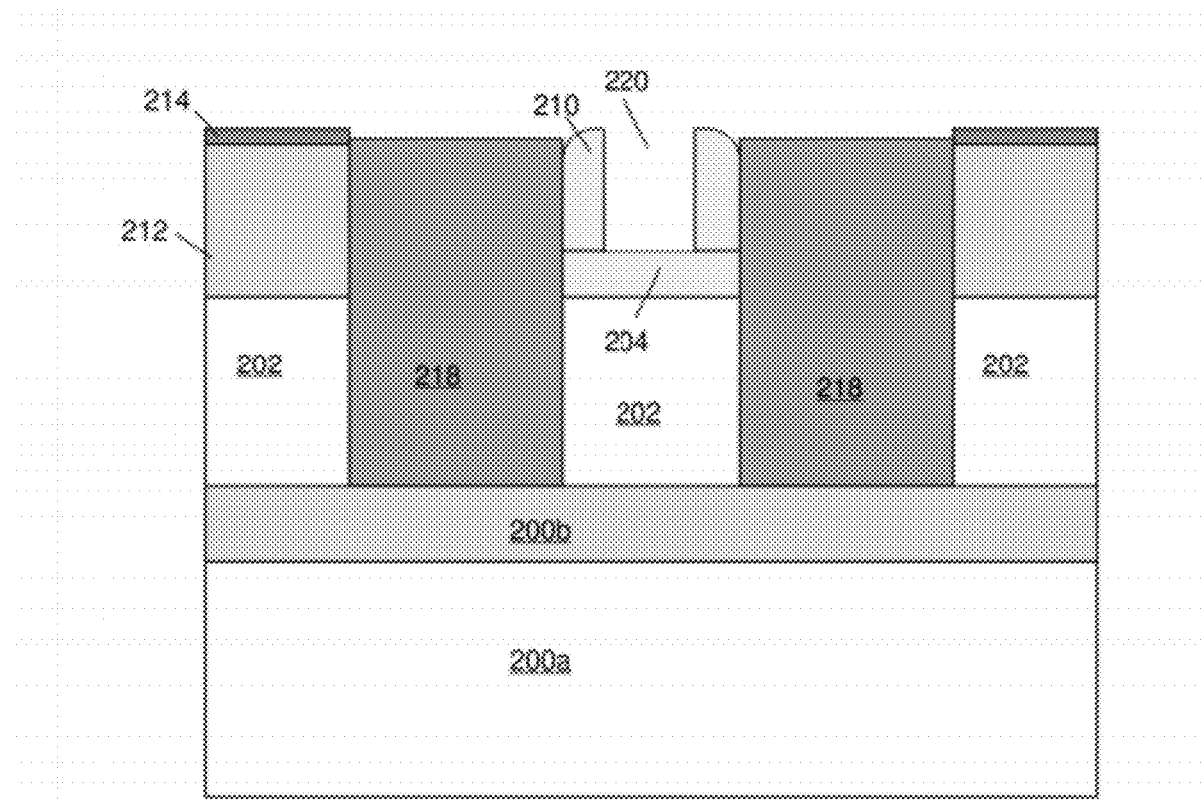
Figure 20:
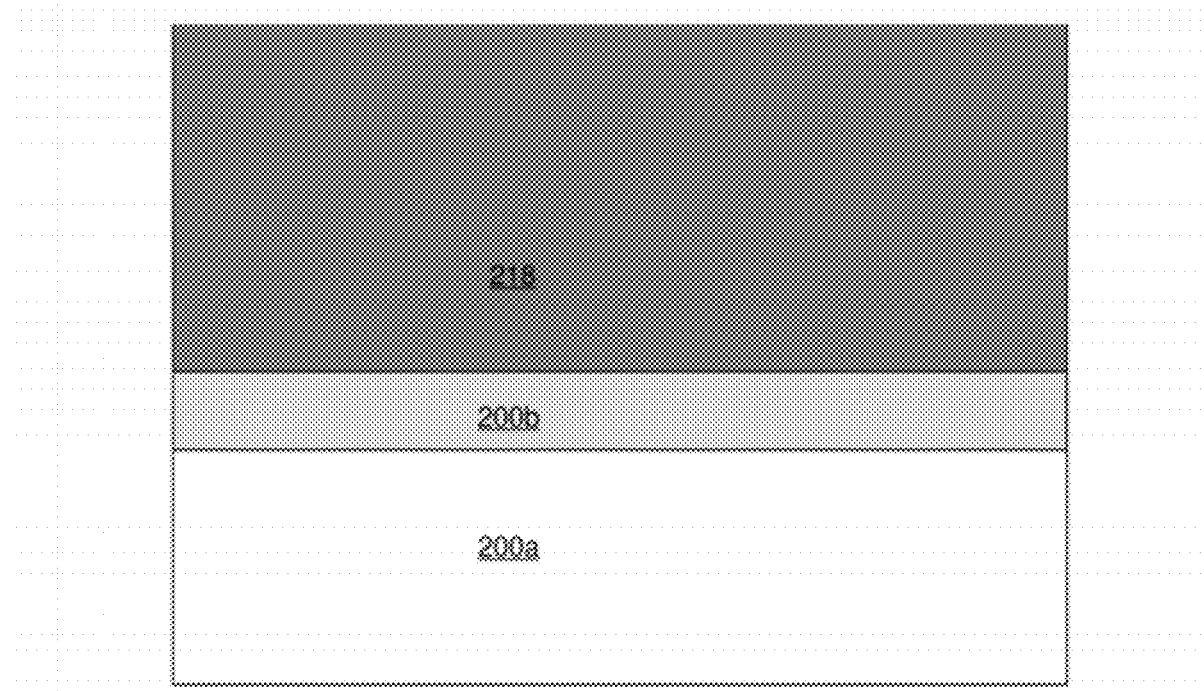

In step S06, the dummy gate 208 is removed, and the first dielectric layer 206 under the dummy gate 208 is removed, to form a gate region opening 220 such that the fin 202 under the dummy gate 208 is exposed in the gate region opening 220, as shown in FIG. 17 (top view), FIG. 18 (section A-A' of FIG. 17), FIG. 19 (section B-B' of FIG. 17) and FIG. 20 (section C-C' of FIG. 17).

The dummy gate 208 may be removed by wet or dry etching, then, the first dielectric layer 206 under the dummy gate 208 may be removed, to fully expose the fin 202 or the cap 204 under the dummy gate 208, thereby forming the gate region opening 220.

Figure 21:
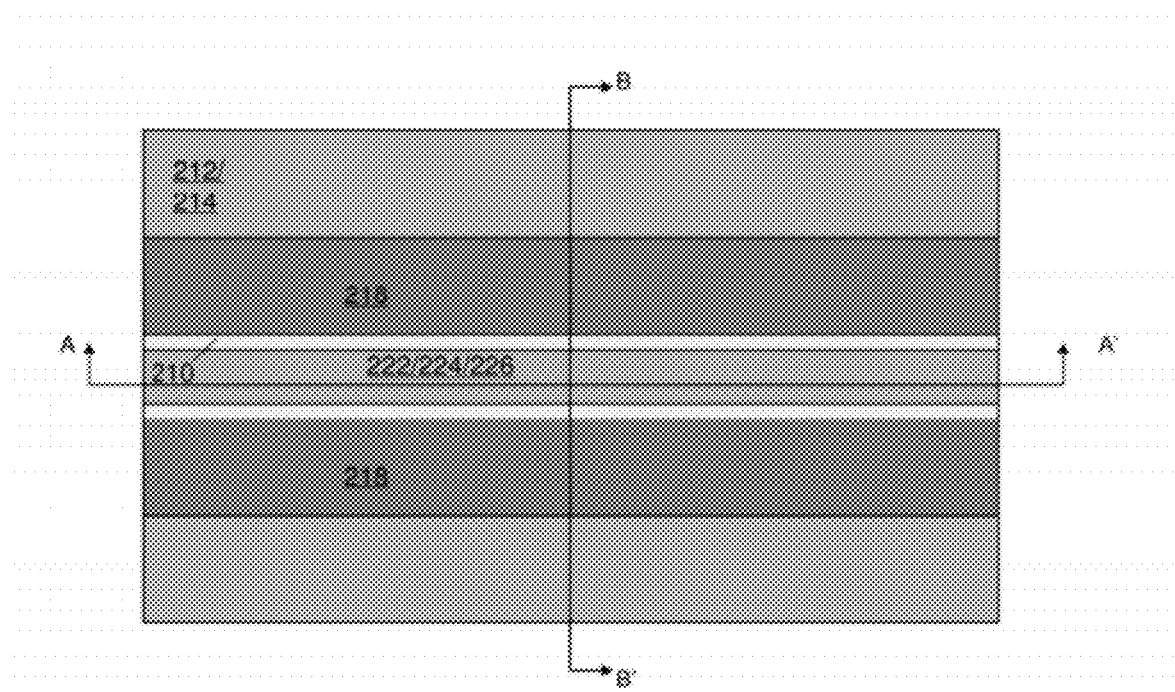
Figure 22:
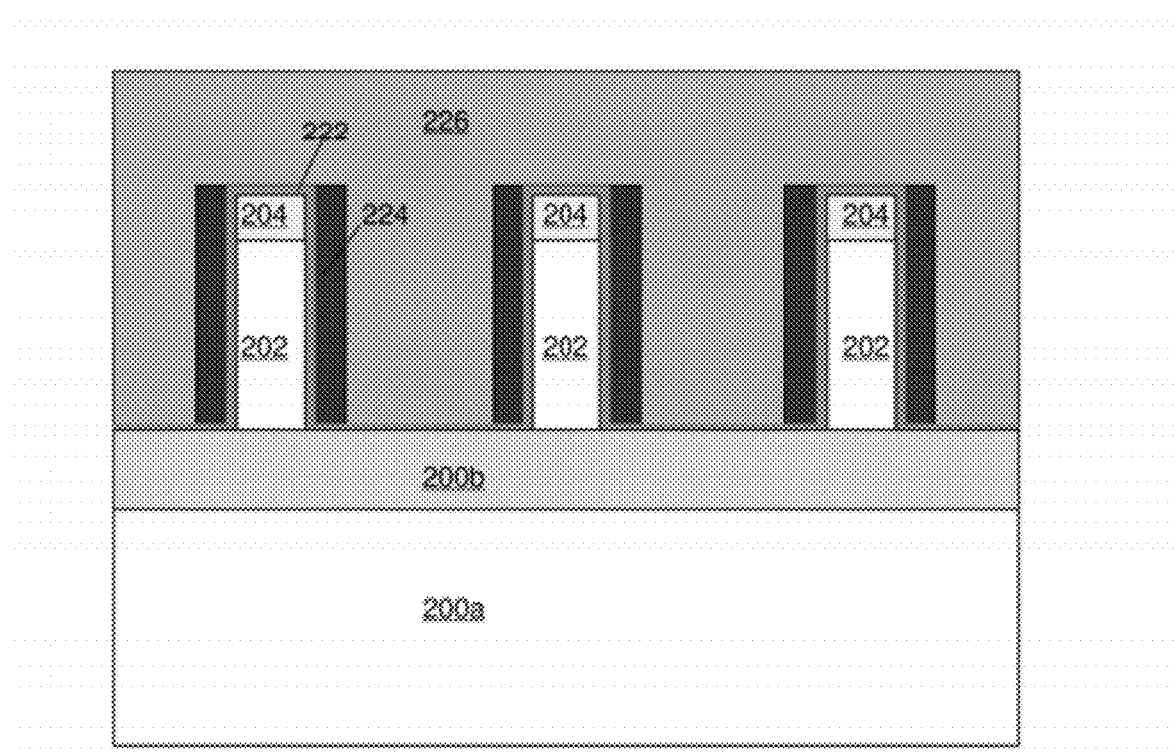
Figure 23:
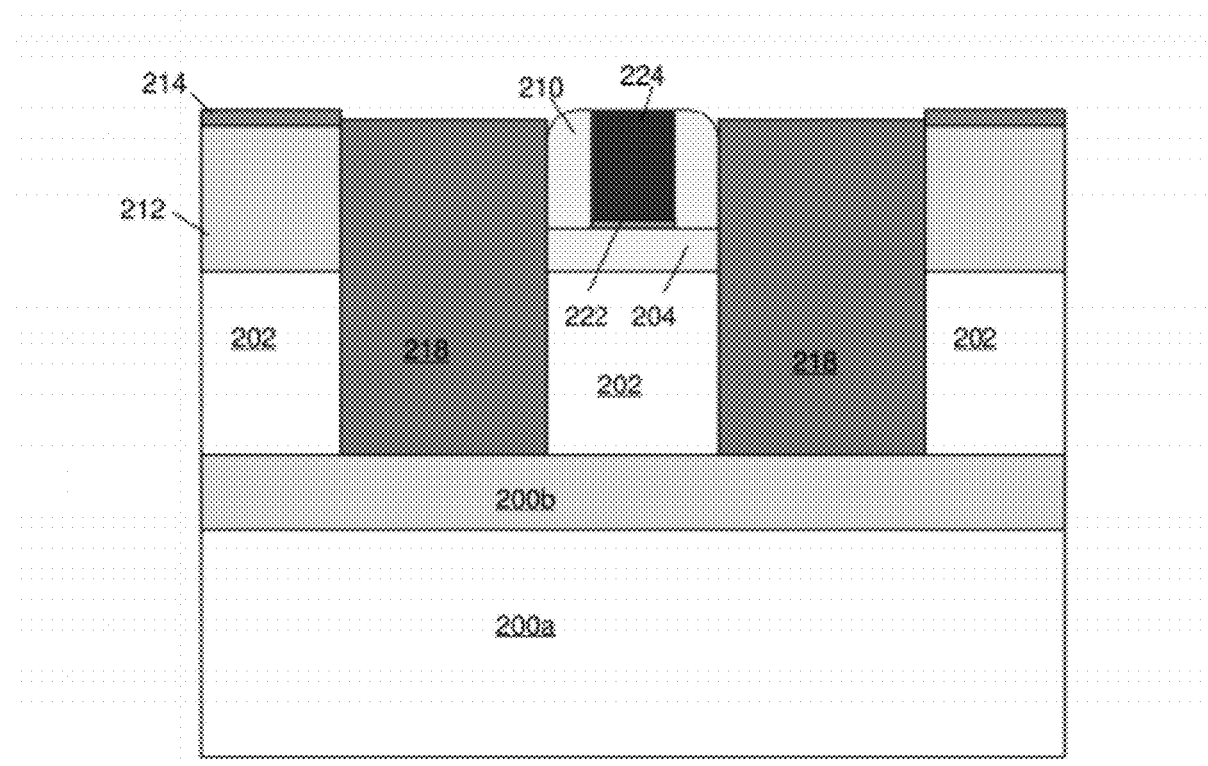

In step S07, the gate region opening 220 is filled up, to form a gate covering the fin 202, as shown in FIG. 21 (top view), FIG. 22 (section A-A' of FIG. 21) and FIG. 23 (section B-B' of FIG. 21) where the gate 230 comprises a gate dielectric layer 222 and a gate electrode 224 and 226.

Specifically, at first a gate dielectric layer 222 covering the fin 202 in the gate region opening 220 may be formed, i.e., the gate dielectric layer 222 covers the sidewalls and the top of the fin in the gate region opening. The gate dielectric layer 222 may have a one-layer structure or a multi-layer structure. In some one-layer structure embodiments, the gate dielectric layer 222 may be made of a high-K dielectric (e.g., a material having a higher dielectric constant than silicon oxide) or other gate dielectric materials. In some multi-layer structure embodiments, the gate dielectric layer 222 may comprise an interface layer and a high-K dielectric layer, with the interface layer being made of, e.g., silicon oxide, silicon nitride, or silicon oxynitride, and the high-K dielectric being, e.g., hafnium oxide, HFO2, HfSiO, HfSiON, HfTaO or HfTiO, which are provided herein as an example, and should not be interpreted as limiting the invention.

Then, a gate electrode 224 may formed on the gate dielectric layer 222. The gate electrode 224 may have a one-layer structure or a multi-layer structure, and may comprise a metal gate electrode or polysilicon, for example, Ti, TiAlx, TiN, TaNx, HfN, TiCx, TaCx, HfCx, Ru, TaNx, TiAlN, WCN, MoAlN, RuOx, polysilicon or other suitable materials, or a combination thereof. In this embodiment, the gate electrode 224 may have a two-layer structure, comprising a metal gate 224 and a polysilicon layer 226. And the metal gate 224 may be formed on only the gate dielectric layer 222 on the sidewalls of the fin 202 by: depositing, e.g., TiN for NFET and TiCx for PFET, and etching. Then polysilicon may be filled in and CMP may be performed, to form the gate covering the fin 202 in the gate region opening 220, i.e., the gate is formed on the sidewalls and the top of the fin, and the gate comprises the gate dielectric layer 222, the metal gate 224 and the polysilicon layer 22. The upper surface of the gate and the upper surface of the source/drain region 218 are in the same plane.

Figure 24:
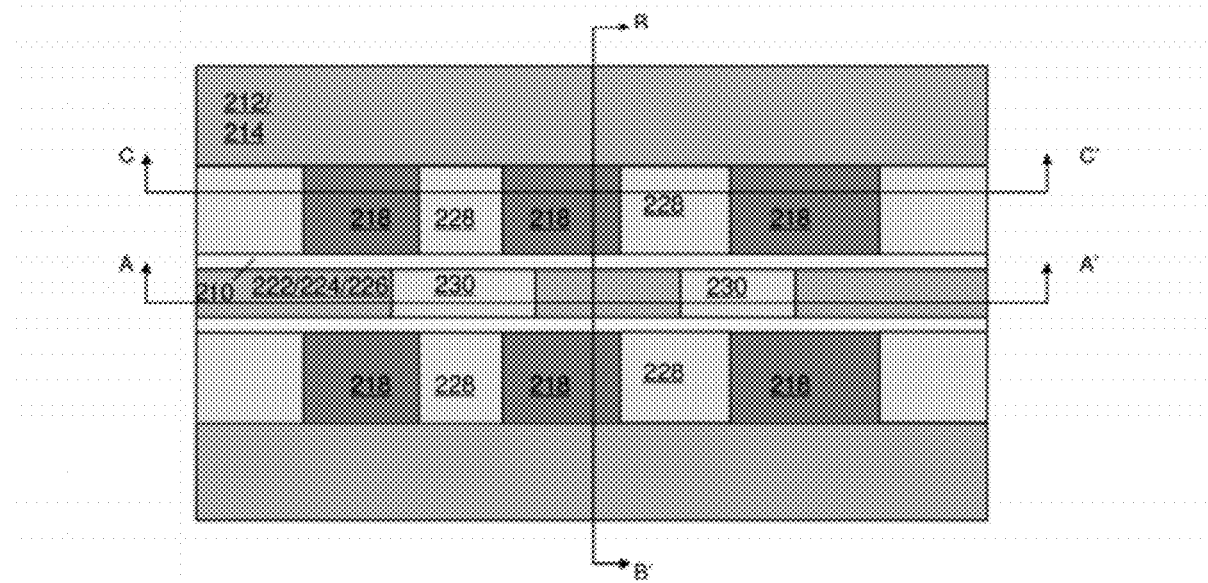
Figure 25:
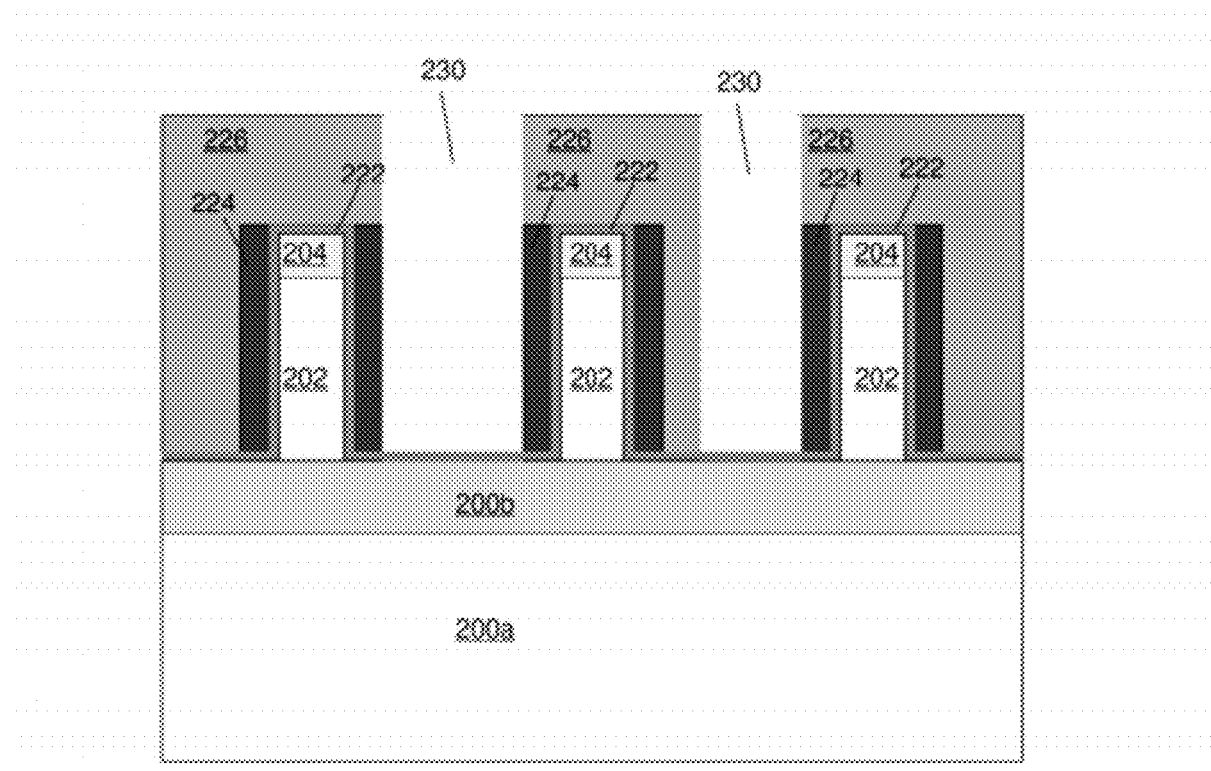
Figure 26:
Figure 27:
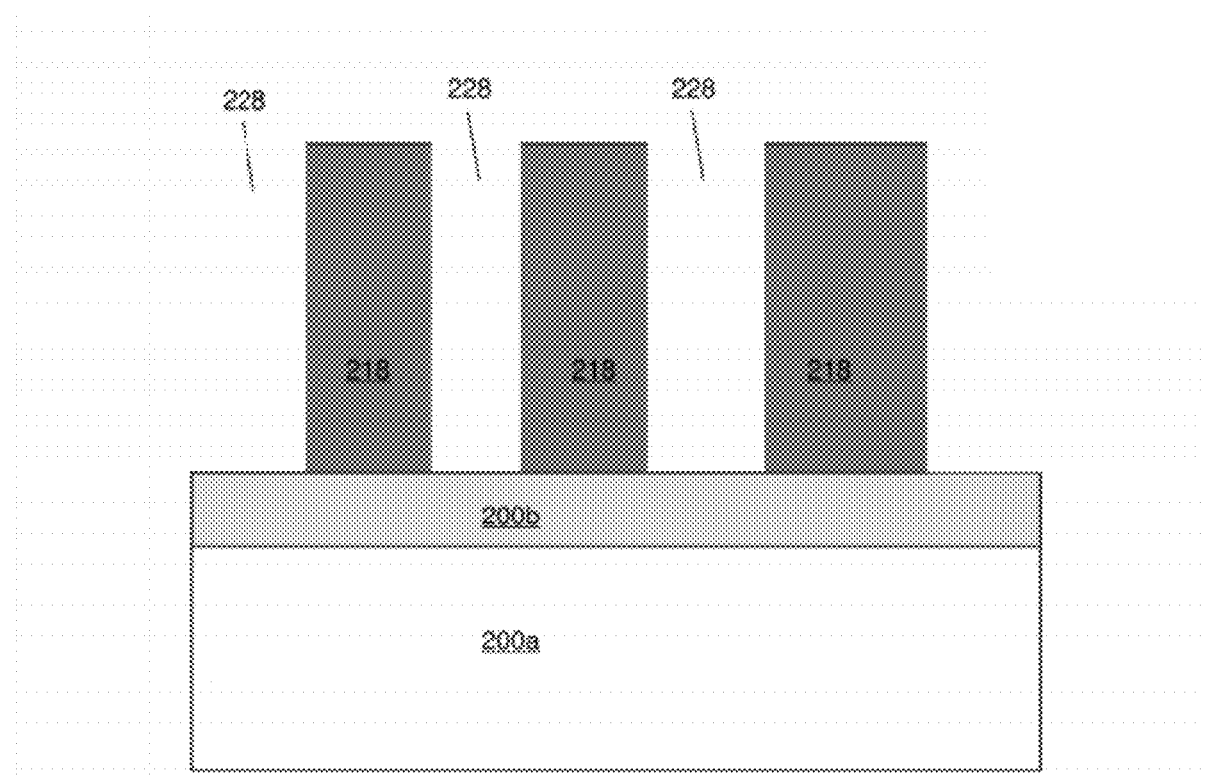

Thus, a plurality of FinFET devices with connected gates and source/drain regions have been formed. Then, according to actual needs, isolation regions may be formed, to separate them into insulated devices, as shown in FIG. 24 (top view), FIG. 25 (section A-A' of FIG. 24). FIG. 26 (section B-B' of FIG. 24) and FIG. 27 (section C-C' of FIG. 24). Firstly, a portion of the gate and a portion of the source/drain region 218 between the fins 202 are removed by etching, to form a gate isolation opening 230 and a source/drain isolation opening 228. Optionally, in forming of the gate isolation opening 230, instead of removing the gate dielectric layer 222, only the gate electrode 224 and 226 is removed, to simplify the process. Preferably, the removed portions of the gate isolation opening 230 and the source/drain isolation opening 228 are not aligned, i.e., the edges of the openings are not in a straight line, hence, the edges of the gate 226 and the edge of the source/drain region are not in a straight line, which helps the alignment of the contact at the gate and the source/drain region to the gate and the source/drain region, respectively, in subsequent contact forming processes. Then, the gate isolation opening 230 and the source/drain isolation opening 228 are filled to form a gate isolation region 234 and a source/drain isolation region 232, as shown in FIG. 28 (top view), FIG. 29 (section AA' of FIG. 28), FIG. 30 (section BB' of FIG. 28) and FIG. 31 (section CC' of FIG. 28).

Figure 28:
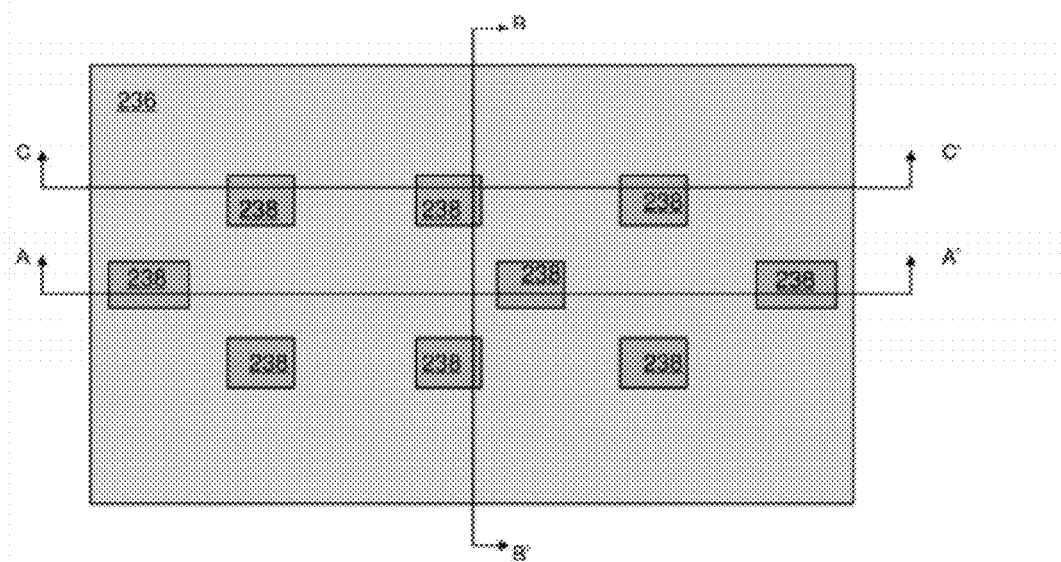
Figure 29:
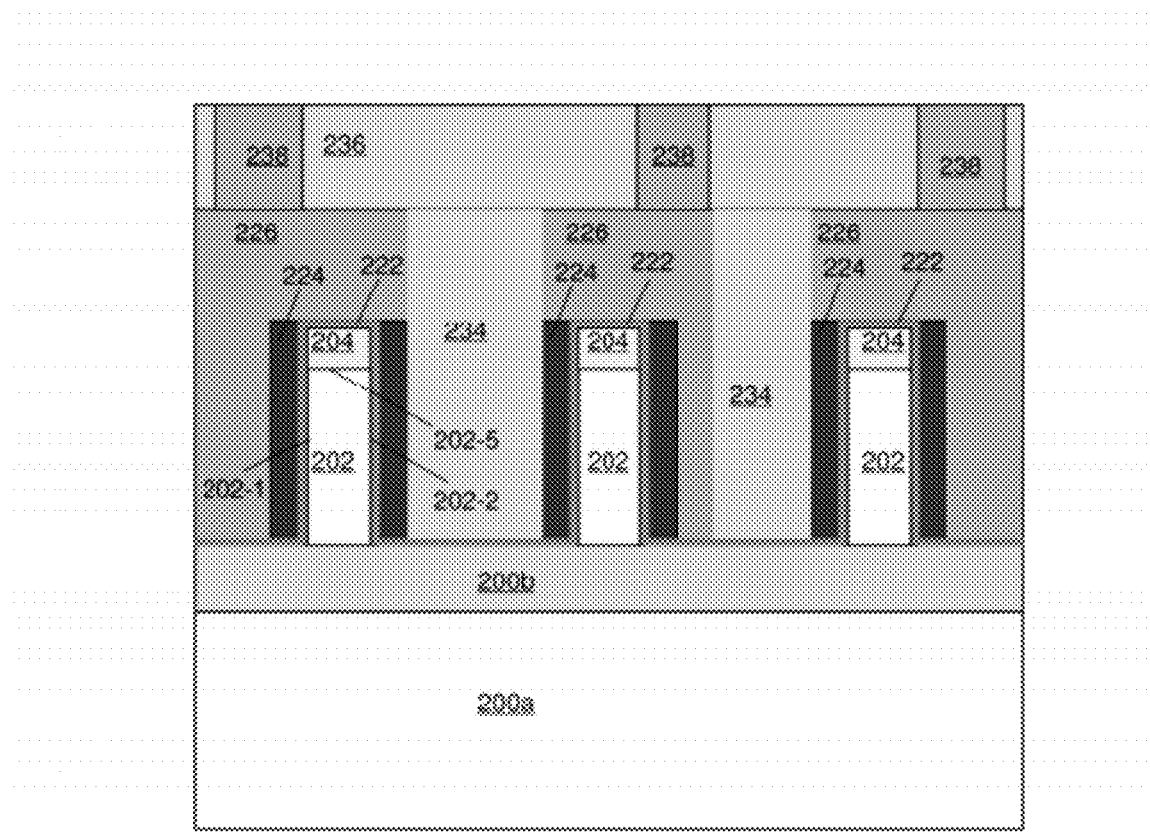
Figure 30:
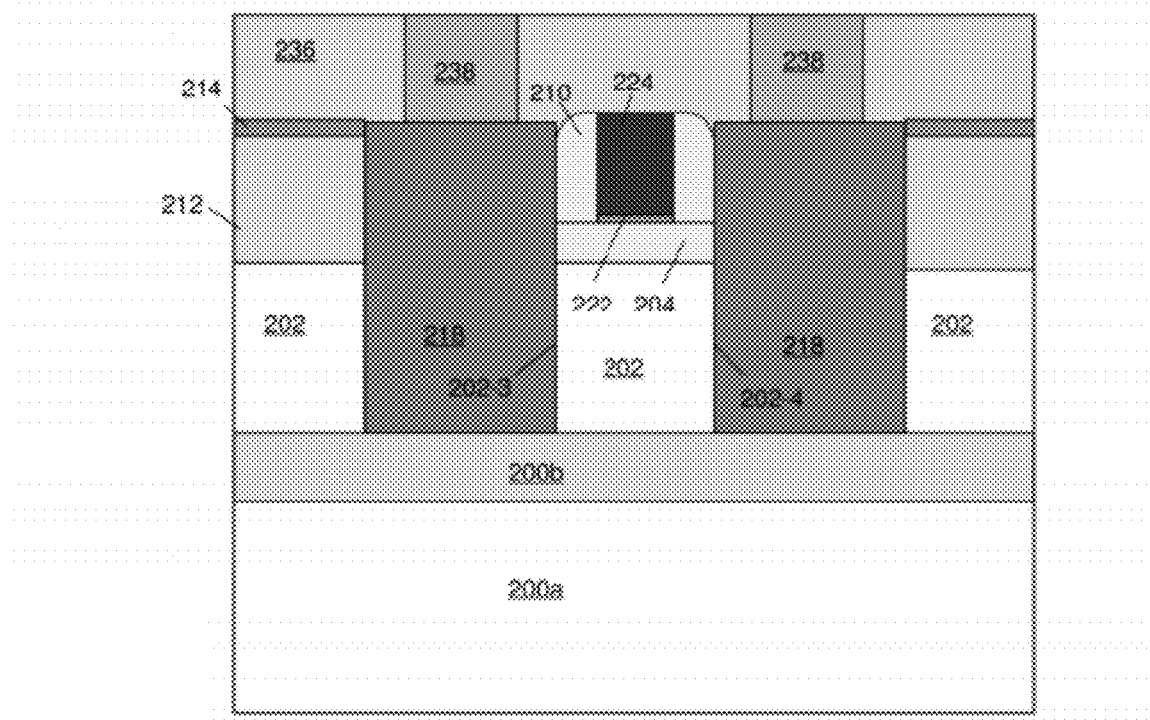
Figure 31:
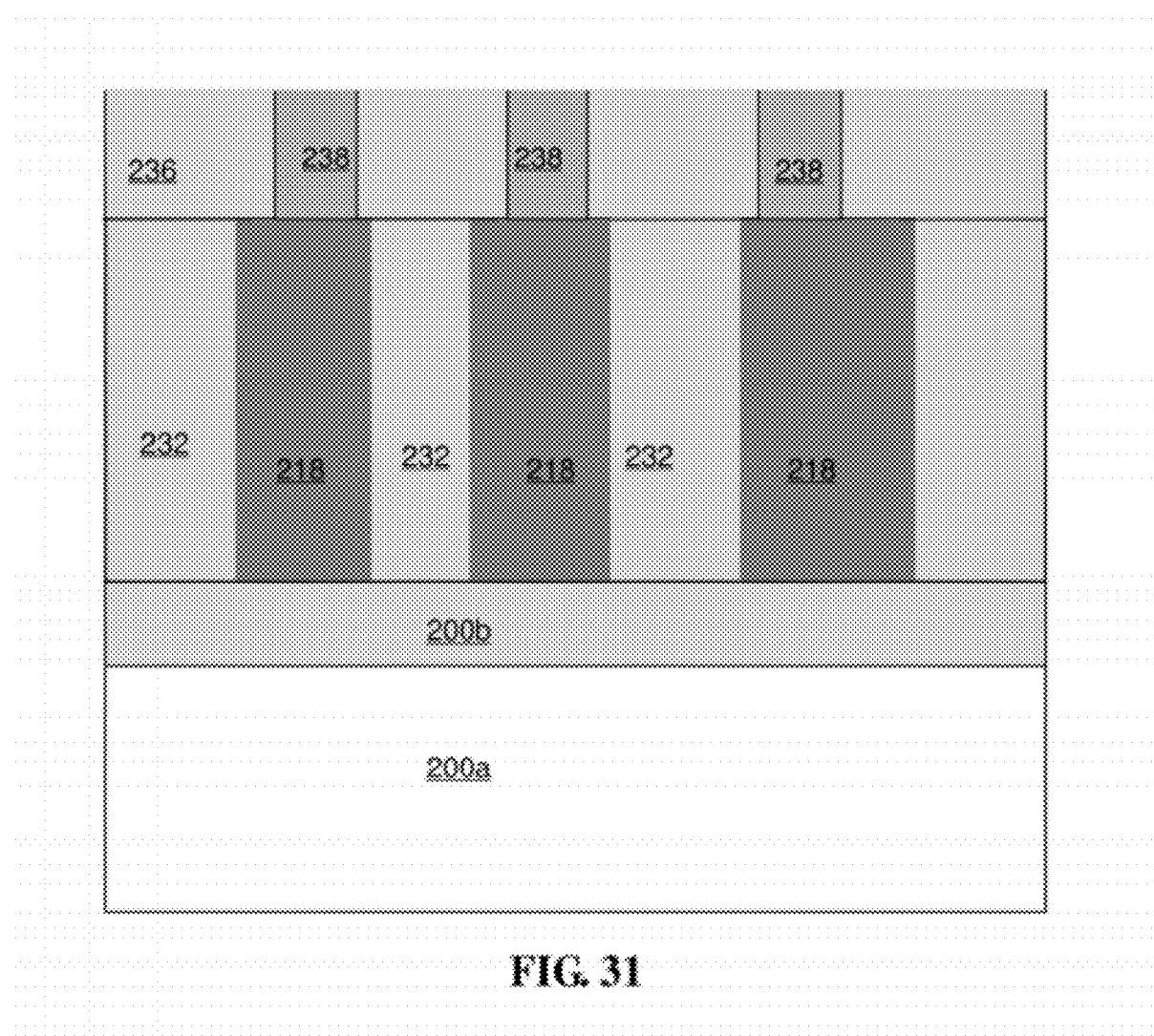

In step S08, a contact plug 238 is formed on the gate 230 and the source/drain region 218, as shown in FIG. 28 (top view), FIG. 29 (section AA' of FIG. 28), FIG. 30 (section BB' of FIG. 28) and FIG. 31 (section CC' of FIG. 28).

Specifically, in this embodiment, firstly a fourth dielectric layer 236 may be deposited. Preferably, this step may be performed together with the step above for filling the gate isolation opening 230 and the source/drain isolation opening 228, and planarization may be performed, so to form the gate isolation region 234, the source/drain isolation region 232 and the fourth dielectric layer 236 at the same time.

Then, the fourth dielectric layer 236 may be etched to form a contact hole on the gate and the source/drain region 218, then, the contact hole may be filled with metal, e.g., W, to form a contact plug 238. The gate and the source/drain region 218 are in the same plane, hence alignment can be achieved more easily and accurately, in comparison with a fin-based device in which the gate and the source/drain region are not equal in height; in addition, the gate and the source/drain region are separated by the spacer 210, which is also good for alignment.

The method for manufacturing a FinFET according to the present invention is described in details above. It is noted that the descriptions above are only preferred embodiments of the present invention, which should not be interpreted as limiting the invention in any form.

The present invention also provides a structure of a Fin Field-Effect Transistor formed according to the method above, as shown in FIG. 28 to FIG. 31, comprising:
a substrate 200a, 200b;
a fin 202 on the substrate, wherein the fin 202 has a first end 202-1 and a second end 202-2 opposing to each other and a third end 202-3 and a fourth end 202-4 opposing to each other;
a gate covering surfaces of the first end 202-1, the second end 202-2 of the fin and an upper surface 202-5 of the fin;
a source/drain region 218 at both sides of the third end 202-3 and the fourth end 202-4 of the fin, wherein an upper surface of the source/drain region and an upper surface of the gate are in the same plane;
a spacer 210 between the gate and the source/drain region 218 above the upper surface 202-5 of the fin; and
a contact plug 238 on the gate and the source/drain region 218.

In this embodiment, the substrate comprises a polycrystalline silicon layer 200a and an isolation layer 200b on the polycrystalline silicon layer 200a. The substrate may also have other structures.

In this embodiment, the gate comprises a gate dielectric layer 222, a metal gate 224 and a polycrystalline silicon layer 226. The gate may have other structures.

In addition, the transistor may further include a source/drain isolation region 232 between adjacent source/drain regions 218, and a gate isolation region 234 between adjacent gates.

In addition, preferably, in the direction along a line connecting the third end 202-3 and the fourth end 202-4 of the fin, the edge of the gate and the edge of the source/drain region 218 are not in a straight line.

Preferred embodiments of the invention are disclosed above, which should not be interpreted as limiting the scope of the invention. Alternations and modifications can be made to the technical solution of the invention by those skilled in the art based on the technical disclosure herein without deviation from the scope of the invention. Therefore, any alternations, equivalents, or modifications made to the embodiments disclosed herein based on the technical essential of the invention without deviation from the scope of the invention should fall within the scope of the invention.

The invention claimed is:

1. A method for manufacturing a Fin Field-Effect transistor, comprising:
providing a substrate;
forming a fin in the substrate, and forming a first dielectric layer on the substrate outside the fin;
forming a dummy gate across the fin on the first dielectric layer and on the fin, forming a spacer on sidewalls of the dummy gate, and forming a cover layer on the first dielectric layer and on the fin outside the dummy gate and the spacer, wherein upper surfaces of both the cover layer and the dummy gate are in the same plane;
removing portions of both the cover layer and the first dielectric layer at both sides of the dummy gate, so as to form a source/drain opening such that the fin at both sides of the dummy gate is exposed in the source/drain opening;
filling up the source/drain opening to form a source/drain region comprising the fin at both sides of the dummy gate;
removing the dummy gate and removing the first dielectric layer under the dummy gate, so as to form a gate region opening such that the fin under the dummy gate is exposed in the gate region opening;
filling up the gate region opening to form a gate covering the fin, such that upper surfaces of both the gate and the source/drain region are in the same plane; and
forming a contact plug on the gate and on the source/drain region.

2. The method according to claim 1, wherein after forming the gate and before forming the contact plug, the method further comprises: removing a portion of the gate and a portion of the source/drain region, and filling to form a gate isolation region and a source/drain isolation region.

3. The method according to claim 2, wherein edges of both the gate and the source/drain region are not aligned in a direction along the fin.

4. The method according to claim 3, wherein the cover layer comprises a second dielectric layer and a third dielectric layer on the second dielectric layer.

5. The method according to claim 3, wherein after the step for forming a fin, the method further comprises: forming a cap layer on the fin, and the method still further comprises:
forming a dummy gate across the fin on both the first dielectric layer and the cap layer, forming a spacer on sidewalls of the dummy gate, and forming a cover layer on the first dielectric layer and on the cap layer outside the dummy gate and the spacer, wherein upper surfaces of both the cover layer and the dummy gate are in the same plane; and
removing the first dielectric layer, the cover layer and the cap layer at both sides of the dummy gate to form a source/drain opening.

6. The method according to claim 3, wherein an upper surface of the first dielectric layer is flush with an upper surface of the fin.

7. The method according to claim 2, wherein the cover layer comprises a second dielectric layer and a third dielectric layer on the second dielectric layer.

8. The method according to claim 2, wherein after the step for forming a fin, the method further comprises: forming a cap layer on the fin, and the method still further comprises:
- forming a dummy gate across the fin on both the first dielectric layer and the cap layer, forming a spacer on sidewalls of the dummy gate, and forming a cover layer on the first dielectric layer and on the cap layer outside the dummy gate and the spacer, wherein upper surfaces of both the cover layer and the dummy gate are in the same plane; and
- removing the first dielectric layer, the cover layer and the cap layer at both sides of the dummy gate to form a source/drain opening.

9. The method according to claim 2, wherein an upper surface of the first dielectric layer is flush with an upper surface of the fin.

10. The method according to claim 1, wherein the step for forming the source/drain region comprises: filling up the source/drain opening by epitaxial growth to form the source/drain region comprising the fin at both sides of the dummy gate.

11. The method according to claim 10, wherein the cover layer comprises a second dielectric layer and a third dielectric layer on the second dielectric layer.

12. The method according to claim 10, wherein after the step for forming a fin, the method further comprises: forming a cap layer on the fin, and the method still further comprises:
- forming a dummy gate across the fin on both the first dielectric layer and the cap layer, forming a spacer on sidewalls of the dummy gate, and forming a cover layer on the first dielectric layer and on the cap layer outside the dummy gate and the spacer, wherein upper surfaces of both the cover layer and the dummy gate are in the same plane; and
- removing the first dielectric layer, the cover layer and the cap layer at both sides of the dummy gate to form a source/drain opening.

13. The method according to claim 10, wherein an upper surface of the first dielectric layer is flush with an upper surface of the fin.

14. The method according to claim 1, wherein the cover layer comprises a second dielectric layer and a third dielectric layer on the second dielectric layer.

15. The method according to claim 14, wherein the second dielectric layer, the third dielectric layer and the spacer are made of different dielectric materials, respectively.

16. The method according to claim 1, wherein after the step for forming a fin, the method further comprises: forming a cap layer on the fin, and the method still further comprises:
- forming a dummy gate across the fin on both the first dielectric layer and the cap layer, forming a spacer on sidewalls of the dummy gate, and forming a cover layer on the first dielectric layer and on the cap layer outside the dummy gate and the spacer, wherein upper surfaces of both the cover layer and the dummy gate are in the same plane; and
- removing the first dielectric layer, the cover layer and the cap layer at both sides of the dummy gate to form a source/drain opening.

17. The method according to claim 1, wherein an upper surface of the first dielectric layer is flush with an upper surface of the fin.

* * * * *